United States Patent
Henwood et al.

(10) Patent No.: US 6,192,220 B1
(45) Date of Patent: Feb. 20, 2001

(54) PHASE LOCK LOOP SYSTEM WITH ULTRAFAST LOCK TIMES FOR HALF DUPLEX TIME DIVISION MULTIPLE ACCESS WIRELESS DATA APPLICATIONS

(75) Inventors: Andrew M. Henwood, Dallas; Everardo D. Ruiz, Richardson, both of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/143,988

(22) Filed: Aug. 31, 1998

(51) Int. Cl.$^7$ ....................................... H04B 1/40
(52) U.S. Cl. ........................... 455/76; 455/84; 455/180.2; 455/260
(58) Field of Search .................................. 455/73, 75, 76, 455/84, 575, 119, 180.3, 259, 260, 264; 375/376; 327/107

(56) References Cited

U.S. PATENT DOCUMENTS 5,184,093 * 2/1993 Itoh et al. ........................ 327/107 X
5,815,504 * 9/1998 Doi ................................... 375/376 X
5,995,812 * 11/1999 Soleimani et al. ................. 455/76 X

* cited by examiner

Primary Examiner—Fan Tsang
Assistant Examiner—Philip J. Sobutka
(74) Attorney, Agent, or Firm—Ronald O. Neerings; Wade James Brady, III; Frederick J. Telecky, Jr.

(57) ABSTRACT

A method of providing low energy consumption ultrafast lock time in a mobile communication system normally operating at slower lock times and requiring occasional ultrafast lock times when switching from the transmit mode to the receive mode and/or from the receive mode to the transmit mode. There are provided a normally operating PLL and a normally disabled DDS. Responsive to a requirement for the ultrafast lock time, the DDS is enabled and substituted for the PLL. Subsequently, responsive to removal of the requirement for the ultrafast lock time, the PLL is substituted for the DDS and the DDS is disabled. When the transmit and/or receive mode requires a frequency above the capability of the DDS, a mixer is added for mixing the output of the DDS with a signal having stable reference frequency to obtain a frequency equal to the sum of frequencies of the DDS output and the stable reference signal. As a further embodiment, when the DDS is enabled and substituted for the PLL, the operating frequency of the PLL is altered and when stabilized at the new operating frequency, the PLL is substituted for the DDS with the DDS being disabled. There is also provided a rapidly stabilized change in frequency of a signal wherein a DDS provides an output at a known frequency with the output of the DDS being mixed with the signal from the source of stable signal of predetermined frequency to obtain a frequency equal to the sum of the frequencies of the DDS output and the stable reference signal higher than the maximum capability of the DDS.

8 Claims, 2 Drawing Sheets

PHASE LOCK LOOP SYSTEM WITH ULTRAFAST LOCK TIMES FOR HALF DUPLEX TIME DIVISION MULTIPLE ACCESS WIRELESS DATA APPLICATIONS

FIELD OF THE INVENTION

This invention relates to a method of providing ultrafast lock times in half duplex time division multiple access wireless data application.

BRIEF DESCRIPTION OF THE PRIOR ART

Communication worldwide presently utilizes a system known as Global System of Mobile Communications (GSM) which is a worldwide standard. At present, this system is being used mainly for voice applications, however, it is expected that this system will be used increasingly, in the future, for data transmission and reception as well. The GSM system utilizes time division multiple access (TDMA) wherein each frequency channel is divided up into a plurality of time slots with each user operating at a particular frequency and in a particular time slot at a given window of time. To switch from channel to channel, it is necessary that the frequency of the mobile device change, this frequency change being provided by changing the frequency of operation of the main oscillator at the mobile device which is generally a voltage controlled oscillator (VCO). The frequency provided by the VCO must be moved very accurately and is moved under control of a reference to a crystal oscillator within the device. The mechanism which controls this change in frequency is known as a phase lock loop (PLL) or frequency synthesizer.

In half duplex operation, the device is either transmitting or receiving, but not both simultaneously. Since transmission and reception are at different frequencies known to the device as determined by the base station, it is necessary that the system cease operation or go to sleep for a short period of time while the oscillator frequency is changed from the transmit mode frequency to the receive mode frequency and vice versa. This is known as "set up time", the set up time required being known at the base station so that transmission from the base station to the mobile device will not start from the time of request for transmission until the set up time has elapsed. This set up time for GSM is presently about 600 microseconds. The set up or switching time (the time for the oscillator to switch from the receive frequency to the transmit frequency and settle down to the switched frequency) required for a switch from reception from to transmission to the base station can be up to about two such time slots because the mobile device must wait for its time slot to arrive in addition to the time required for the frequency change. In addition, there is a problem of worsened system phase noise and feed-through spur suppression as a result of faster switching time. A tradeoff is required among these parameters since compensation for one will adversely affect the others.

The present technology in wireless phase lock loop systems is either an integer N or fractional N synthesizer used to lock the voltage controlled oscillator (VCO) of the system to the desired frequency. In the current standard approach, the fractional N synthesizer is used for applications where faster switching times are required. However, in order to obtain the increased bandwidth which is required for data transmission, the transmit and receive cycles will occupy several consecutive time slots rather than single time slots periodically spaced from each other. Also, less set up time will be allowed to save space in the time domain as well as to meet expected new standards. Accordingly, the next generation of GSM systems will require a lock time of about 100 to 120 microseconds between the receive and transmit functions. This lock time is either beyond the ability of state of the art fractional N architecture or requires architecture which is always in condition to accommodate the fastest expected switching time and therefore constantly suffers from the problems of worsened system phase noise and feed through spur suppression as discussed above whereas the improved lock time is generally required for only a small percentage of the total transmission time utilized by the mobile device, thereby seriously diminishing the performance of the system when the fast lock time is not required. It follows that a new improved architecture is required.

SUMMARY OF THE INVENTION

In accordance with the present invention, the above described problem inherent in the prior art is overcome and there is provided a phase lock loop system capable of operation in about the 120 microsecond time frame.

Briefly, the above is accomplished by taking advantage of a prior art direct digital synthesizer (DDS) in conjunction with a traditional synthesizer. DDSs are well known and provide a stable step output wave of predetermined type which is then filtered to provide an output smooth sine wave which is up to one half of the frequency of a stable reference input to the DDS. For most wireless applications presently required, DDS is presently not a viable alternative for wireless applications. DDSs at present can only provide output frequencies up to about 300 to 400 MHz and in any event less than 500 MHz, which is inadequate for most wireless systems and especially commercial wireless systems. For example, GSM operates at frequencies in the range of 880 to 960 Mhz., it being understood that the present invention is not limited to GSM In addition, a DDS consumes very large amounts of power and has limited frequency range. This makes the use of the DDS alone impractical for mobile systems due to the enormous battery drain required for operation.

The approach used in accordance with the present invention to overcome these limitations of a DDS is to use, during normal operation for a Global System of Mobile Communications (GSM) or TDMA telephone (a well known digital communication system), a traditional integer N or fractional N synthesizer to switch the VCOs to the desired frequency. However, when the telephone goes into the data mode or some other mode that requires the wireless application to change its operating frequency from transmit to receive and/or vice versa, such as, for example, within about 120 microseconds of each other, the DDS approach is used in place of the traditional integer or fractional N synthesizer. A DDS requires programming and an input clock frequency. The programming comes from the digital signal processor (DSP) in the telephone and the clock frequency is the locked intermediate frequency (IF) VCO. This ensures that the DDS is phase locked with the rest of the system.

The system in accordance with the present invention requires a very careful frequency plan for the radio to take into consideration the frequency range limitation of the DDS and also that the DDS would require clocking with the IF VCO. A consideration of output spurs from the mixed output of the DDS and the IF VCO is critical. The lock-detect pin on the PLL chip, which is well known prior art technology, is designed to drive the necessary additional switches when the PLL has reached the lock state. The careful switching approach between the locked VCO and the DDS and IF VCO output is crafted to stop any phase glitches between the two signals. The four required switches are designed to be fast and low loss. This implementation requires a DDS circuit as well as an additional mixer and filter.

For operation of the system in accordance with the present invention, initially, the PLL is operating at the receive frequency using the traditional PLL synthesizer of the prior art. When the mobile unit is to go into the data transmission mode, the DDS is tuned to the correct frequency for transmission with reception being terminated and, simultaneously, the PLL is commenced to be tuned to the correct transmit frequency. After the 120 microsecond set up time has elapsed, transmission is commenced using the DDS and then, when the PLL has stabilized at the transmit frequency, such as, for example, after 400 to 600 microseconds, the PLL takes over and the DDS is turned off. In this way, the DDS is used only when the 120 second set up time is required and, even then, is used only until the PLL has stabilized and is able to take over the function of providing the required operating frequency signal. In this way, the DDS is used for only a small percentage of the time when data is being transmitted, data transmission itself generally representing only a small percentage of total device usage.

As a second embodiment of the invention, the above described system can be used with the DDS operating for the entire period of data transmission rather than for the small portion of the time required for the PLL to stabilize. While this system uses added power during data transmission than does the above described system, there is still a substantial saving of power utilization as well as a requirement for less circuitry in the system.

DESCRIPTION OF THE PREFERRED EMBODIMENT

Figure 1:
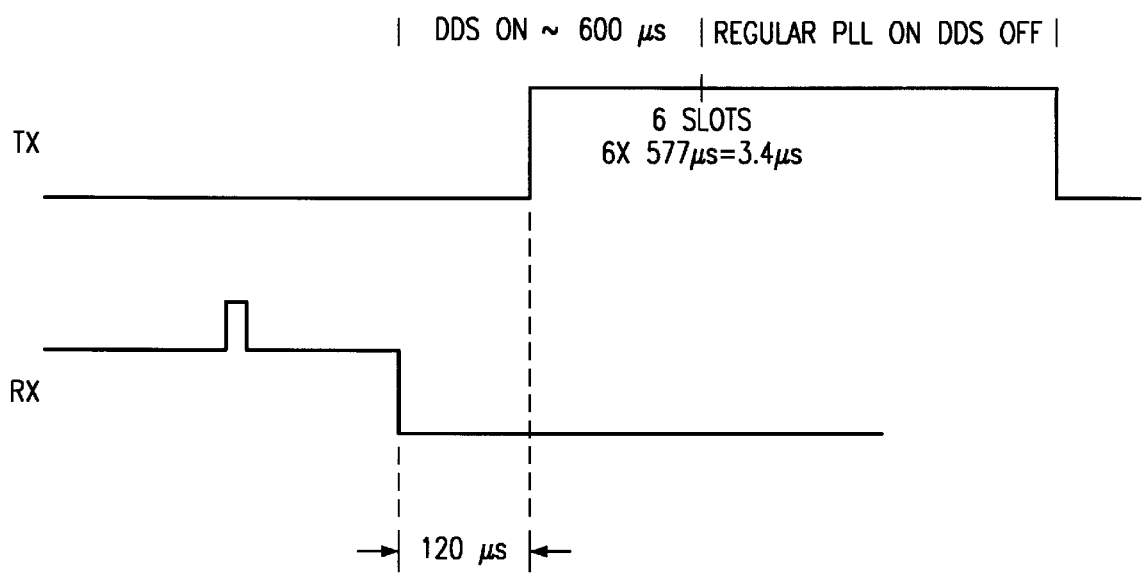
FIG. 1 is a timing diagram which depicts operation of the system of the present invention.

Referring first to FIG. 1, there is shown a timing diagram which represents operation of the system in accordance with the present invention. The upper line represents the status of the mobile unit in the transmit mode and the lower line represents the status of the mobile unit in the receive mode. Initially, the PLL is at the receive frequency using the traditional PLL synthesizer of the prior art. An initial pulse is provided by an external device, such as, for example, a digital signal processor (DSP), at the receive frequency to wake up the PLL from the sleep mode, if in that mode or to change the frequency at which the PLL is operating. When the mobile unit is to go into the data transmission mode, the DDS is turned on at (1) and tuned to the correct frequency for transmission with reception being terminated and, simultaneously, the PLL is being tuned to the correct transmit frequency. After the 120 microsecond set up time has elapsed, transmission is commenced using the DDS at (2) and then, when the PLL has stabilized, the PLL takes over and the DDS is turned off at (3). Operation then continues as in the prior art as explained hereinabove. In this way, the DDS is used only when the 120 microsecond set up time is required and, even then, is used only until the PLL has stabilized and is able to take over the function of providing the required operating frequency signal.

Figure 2:
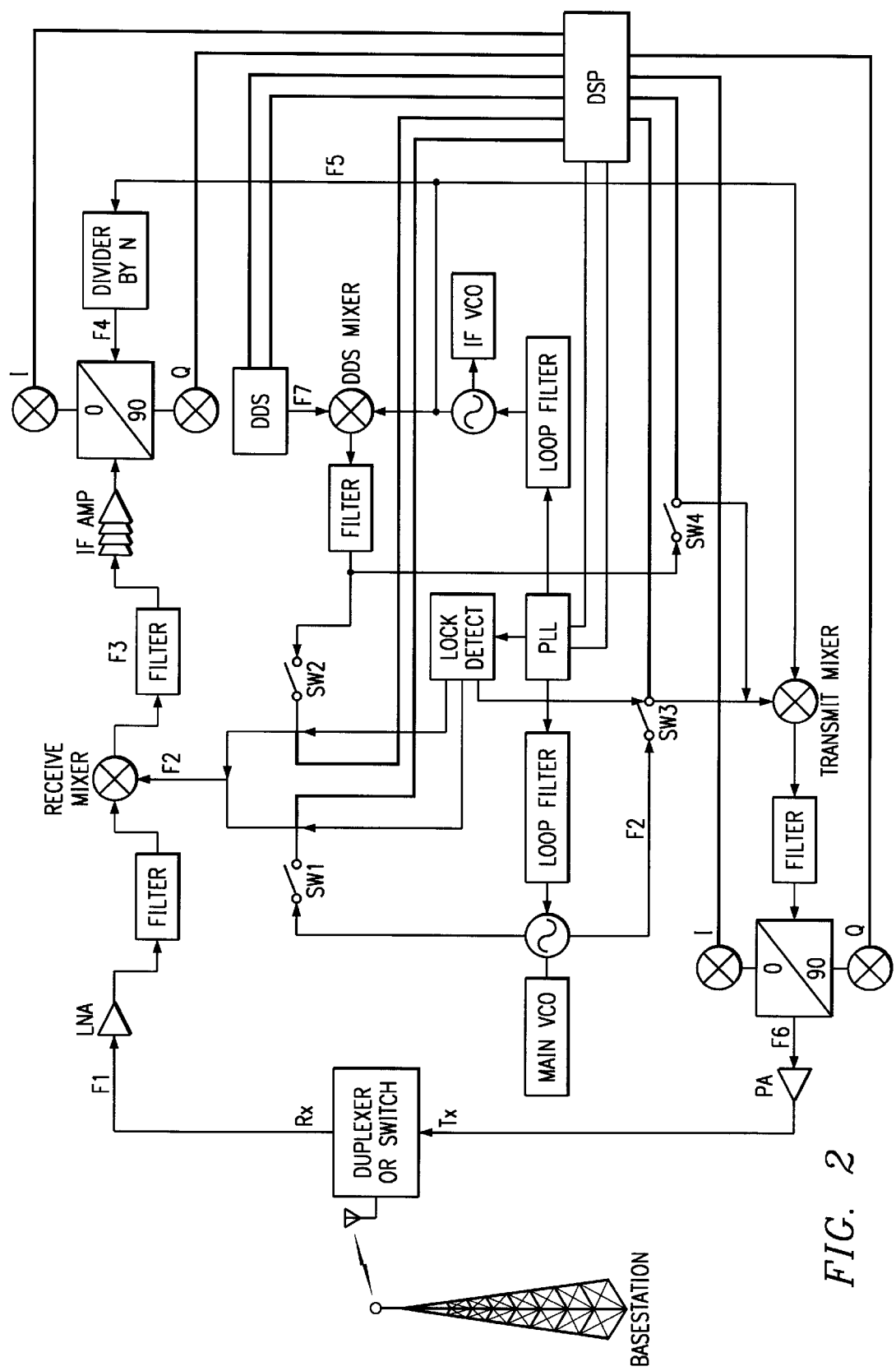
FIG. 2 is a circuit diagram of a phase lock loop (PLL) system with ultrafast lock times for half duplex time division multiple access (TDMA) wireless data applications in accordance with the present invention.

Referring to FIG. 2, there is shown a circuit diagram of a phase lock loop (PLL) system with ultrafast lock times for half duplex time division multiple access (TDMA) wireless data applications in accordance with the present invention. The system includes a duplexer or switch coupled to an antenna for directing received information in the Rx direction and for receiving information to be transmitted from the Tx direction.

In the receive mode, information received at the antenna at a receive frequency $f_1$ is passed in the Rx direction through a low noise amplifier (LNA) and an image filter to a receive mixer. Also passed to the receive mixer is a second frequency signal $f_2$ from the local oscillator or main VCO through switch SW1 when switch SW1 is closed. The output of the receive mixer is filtered to provide an intermediate frequency or IF signal $f_3$ which is $f_1-f_2$, the IF signal $f_3$ being amplified by an IF adjustable gain amplifier and passed to I and Q demodulators along with a signal $f_4$ which is equal to $f_3$. The I and Q demodulator provides I and Q outputs which are 90 degrees out of phase with each other and modulated about baseband or very low frequency, about 0 to about 130 KHz. The I and Q outputs are then sent to a utilization device such as, for example, a digital signal processor (DSP) for conversion thereof into digital code or the like, as is well known and which forms no part of this invention. The signal $f_4$ is provided by an IF VCO which provides a signal at a frequency $f_5$, this $f_5$ frequency by being divided down to the frequency $f_4$ by a divide by N circuit where $f_5/N=f_4$. It is the I and/or N outputs which are then sampled external to the circuit of interest herein.

In the transmit mode, data in the form of I and Q bits are provided at an I and Q mixer in orthogonal manner with the output of the I and Q mixer being modulated to provide a frequency $f_6$ through an amplifier to the duplexer or switch. to the antenna. The other input to the I and Q mixer is from the filtered output of a transmit mixer which receives the output signal $f_2$ from the main VCO via switch SW3 and the output signal $f_5$ from the IF VCO to provide the frequency $f_6$ to the I and Q mixer. The filter allows only the desired frequency to pass therethrough with other frequencies developed in the transmit mixer being filtered out.

During normal mode operation, such as voice or any other type of operation with no setup time of less than 600 microseconds required, switch SW1 will be closed, switch SW2 will be open, switch SW3 will be closed, switch SW4 will be open and DDS will be disabled. In this case, both the receive mixer and the transmit mixer are receiving the main VCO output and these mixers are receiving no output from the DDS, at which time the frequency of operation of the main VCO and the IF VCO are both being controlled by the PLL via a loop filter under control of an external main controller, such as a DSP, for example.

During the data mode of operation or any other operating mode requiring very fast set up time, less than about 600 microseconds, there is a switch from normal mode operation to data mode operation. In this mode, the DDS must be enabled with the correct operating frequency being programmed for control of the DDS, for example, by a DSP via a data bus external of the present circuit.

In the data receive mode of operation, switch SW1 is open, switch SW2 is closed and the condition of switches SW3 and SW4 is irrelevant since they are on the transmit side of the circuit. The PLL or synthesizer is programmed to the new receive frequency. When the PLL reaches the correct frequency, the lock detect circuit, which is triggered when the PLL reaches the correct frequency, detects this fact and turns off the DDS. Switch SW3 is concurrently closed and switch SW4 is concurrently opened In the data transmit mode of operation, the DDS is enabled, switch SW3 is opened and switch SW4 is closed. The condition of switches SW1 and SW2 is irrelevant since they are on the receive side of the circuit. The PLL is programmed to the new transmit frequency with operation taking place based upon the output of the DDS. When the PLL has reached the transmit frequency, the lock detect circuit senses this fact and disables the DDS while causing switch S4 to open and switch S3 to close with the PLL taking over.

Under current technology, the DDS is incapable of providing frequencies above about 500 MHz. To overcome this problem and provide frequencies higher than the DDS capability, and as a further feature of the present invention, the output of the DDS is sent to a DDS mixer where the DDS output frequency $f_7$ is mixed with the $f_5$ output of the IF VCO. While the output of the IF VCO is used herein, it should be understood that any auxiliary device can be used to provide for mixing with the output of the DDS and the IF VCO is used herein merely by way of example to minimize the required circuitry. The output of the DDS mixer includes $f_7 \pm f_5$. By utilizing the sum of these frequencies sent to the DDS mixer, frequencies higher than the maximum obtainable from the DDS can be obtained. The frequencies $f_7$ and $f_5$ are crafted so that $f_7+f_5=f_2$ or $f_7+f_5=f_6$ with the filter at the output of the DDS mixer filtering out all other frequencies created in the DDS mixer. Of course, if the DDS is capable of providing the desired frequency directly, the DDS mixer can be eliminated.

To recapitulate, in switching from normal operating mode to the data mode, initially the DDS is enabled after being programmed to the correct frequency in known manner.

In the receive mode, switch SW1 is opened and switch SW2 is closed. The PLL is programmed to the new receive frequency in known manner and reception takes place under control of the DDS. When the PLL has stabilized at the receive frequency, switch SW1 is closed, switch SW2 is opened, the PLL takes over for the DDS and the DDS is disabled.

In the transmit mode, switch SW4 is closed and switch SW3 is opened. The PLL is programmed to the new transmit frequency in known manner and transmission takes place under control of the DDS. When the PLL has stabilized at the transmit frequency, switch SW4 is opened, switch SW3 is closed, the PLL takes over for the DDS and the DDS is disabled.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of providing low energy consumption ultrafast lock time in a communication system normally operating at slower lock times and requiring occasional relatively ultrafast lock times when switching from a first mode having said slower lock times to a mode where ultrafast lock times are required, which comprises the steps of:
   (a) providing said communication system having a PLL operating at a receive frequency and a disabled DDS; and
   (b) responsive to a requirement for said ultrafast lock time
      (i) tuning said DDS to a transmission frequency for transmission while simultaneously tuning said PLL to said transmission frequency for transmission;
      (ii) then commencing transmission with said DDS at said transmission frequency; and
      (iii) terminating operation of said DDS and substituting said PLL for said DDS when said PLL has been tuned to said transmission frequency.

2. The method of claim 1 wherein said transmit and/or said receive mode requires a frequency above the capability of said DDS, further including a mixer for mixing the output of said DDS with a signal having stable reference frequency to obtain a frequency equal to the sum of frequencies of said DDS output and said stable reference signal.

3. A method of providing low energy consumption ultrafast lock time in a communication system normally operating at slower lock times and requiring occasional relatively ultrafast lock times when switching from a first mode having said slower lock times to a mode where ultrafast lock times are required, which comprises the steps of:
   (a) providing said communication system having an operating PLL and a disabled DDS; and
   (b) responsive to a requirement for said ultrafast lock time
      (i) enabling and substituting said DDS for said PLL while altering the operating frequency of said PLL; and
      (ii) substituting said PLL for said DDS when said PLL has stabilized to said altered operating frequency and disabling said DDS.

4. The method of claim 3 wherein said transmit and/or said receive mode requires a frequency above the capability of said DDS, further including a mixer for mixing the output of said DDS with a signal having stable reference frequency to obtain a frequency equal to the sum of frequencies of said DDS output and said stable reference signal.

5. the method of claim 3 wherein said communication systems is mobile.

6. The method of claim 3 further including the step of, responsive to removal of said requirement for said ultrafast lock time, substituting said PLL for said DDS and disabling said DDS.

7. The method of claim 6 wherein said transmit and/or said receive mode requires a frequency above the capability of said DDS, further including a mixer for mixing the output of said DDS with a signal having stable reference frequency to obtain a frequency equal to the sum of frequencies of said DDS output and said stable reference signal.

8. A method of providing low energy consumption ultrafast lock time in a communication system normally operating at slower lock times and requiring occasional relatively ultrafast lock times when switching from a first mode having said slower lock times to a mode where ultrafast lock times are required which comprises the steps of:
   (a) providing said communication system having an operating PLL and a disabled DDS; and
      (i) tuning said DDS to an operating frequency;
   (b) responsive to a requirement for said ultrafast lock time
      (ii) enabling and substituting said DDS for said PLL;
      (iii) then substituting said PLL for said DDS when said PLL has been tuned to said frequency;
      wherein said communication system is mobile.

* * * * *